(12) United States Patent
Zhao et al.

(10) Patent No.: US 11,917,860 B2
(45) Date of Patent: Feb. 27, 2024

(54) METHOD OF MANUFACTURING DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Lei Zhao, Hubei (CN); Gaozhen Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 882 days.

(21) Appl. No.: 16/965,379

(22) PCT Filed: Nov. 21, 2019

(86) PCT No.: PCT/CN2019/120052
§ 371 (c)(1),
(2) Date: Jul. 28, 2020

(87) PCT Pub. No.: WO2021/042578
PCT Pub. Date: Mar. 11, 2021

(65) Prior Publication Data
US 2023/0165048 A1   May 25, 2023

(30) Foreign Application Priority Data
Sep. 2, 2019 (CN) .......................... 201910822849.X

(51) Int. Cl.
*H10K 59/12* (2023.01)
*H10K 59/80* (2023.01)

(52) U.S. Cl.
CPC ..... *H10K 59/1201* (2023.02); *H10K 59/8731* (2023.02)

(58) Field of Classification Search
CPC ........... H01K 59/1201; H01K 59/8731; H10K 59/1201; H10K 59/8731
USPC ......................................................... 438/23
See application file for complete search history.

(56) References Cited

U.S. PATENT DOCUMENTS

| 2010/0141135 A1 | 6/2010 | Kase et al. |
| 2019/0081277 A1 | 3/2019 | Wang et al. |
| 2021/0091337 A1* | 3/2021 | Zhao .................. H10K 50/8445 |

FOREIGN PATENT DOCUMENTS

| CN | 104183783 A |   | 12/2014 |
| CN | 105024018 A | * | 11/2015 |
| CN | 105845845 A |   | 8/2016 |
| CN | 107394054 A |   | 11/2017 |

(Continued)

*Primary Examiner* — Igwe U Anya
(74) *Attorney, Agent, or Firm* — PV IP PC; Wei Te Chung; Zhigang Ma

(57) ABSTRACT

A method of manufacturing a display panel includes fabricating a display portion on a glass substrate; forming a barrier layer on the glass substrate outside the display portion; forming an encapsulation film on the barrier layer and the display portion; and obtaining a panel area by removing the barrier layer and the encapsulation film outside a predetermined limited area on the glass substrate. The predetermined limited area corresponds to the display portion.

14 Claims, 4 Drawing Sheets

(56) References Cited

FOREIGN PATENT DOCUMENTS

| CN | 107403883 | A |   | 11/2017 | | |
|----|-----------|---|---|---------|---|---|
| CN | 107845737 | A |   | 3/2018  | | |
| CN | 108258149 | A |   | 7/2018  | | |
| CN | 108581096 | A |   | 9/2018  | | |
| CN | 108962937 | A | * | 12/2018 | ............ | H01L 21/77 |
| CN | 208655653 | U | * | 3/2019  | | |
| CN | 109801953 | A |   | 5/2019  | | |

* cited by examiner

METHOD OF MANUFACTURING DISPLAY PANEL

BACKGROUND OF INVENTION

1. Field of Invention

The present invention relates to a technical field of displays, and particularly to, a method of manufacturing a display panel.

2. Related Art

Current organic light-emitting diode display panels are mainly encapsulated in a manner using first inorganic layers, organic layers, and second inorganic layers alternatively arranged, wherein the inorganic layers are generally formed by chemical vapor deposition (CVD) coating and the organic layers are formed by inkjet printing.

However, since masks are required during CVD processes, and reaction gases diffuse to edges during the CVD processes, bottoms of side walls of the second inorganic layers will extend outward, thereby adversely affecting characteristics of the edges of organic light-emitting diode (OLED) devices and resulting in an increase in frames of display panels.

Therefore, it is imperative to provide a method of manufacturing a display panel to overcome the problem of the prior art.

SUMMARY OF INVENTION

An object of the present invention is to provide a method of manufacturing a display panel to reduce a frame of the display panel.

In order to achieve the above-mentioned object, the present invention provides a method of manufacturing a display panel, comprising fabricating a display portion on a glass substrate; forming a barrier layer on the glass substrate outside the display portion, wherein the barrier layer is adhesively attached to the glass substrate outside the display portion; forming an encapsulation film on the barrier layer and the display portion; separating the barrier layer and the encapsulation film outside a predetermined limited area on the glass substrate from the barrier layer and the encapsulation film in the predetermined limited area; and obtaining a panel area by peeling away the barrier layer and the encapsulation film outside the predetermined limited area, wherein the predetermined limited area corresponds to the display portion.

The present invention further provides a method of manufacturing a display panel, comprising fabricating a display portion on a glass substrate; forming a barrier layer on the glass substrate outside the display portion; forming an encapsulation film on the barrier layer and the display portion; and obtaining a panel area by removing the barrier layer and the encapsulation film outside a predetermined limited area on the glass substrate, wherein the predetermined limited area corresponds to the display portion.

A method of manufacturing a display panel of the present invention is implemented by fabricating a display portion on a glass substrate; forming a barrier layer on the glass substrate outside the display portion; forming an encapsulation film on the barrier layer and the display portion; and removing the barrier layer and the encapsulation film outside a predetermined limited area on the glass substrate to obtain a panel area, wherein the predetermined limited area corresponds to the display portion. Because a film formation area of inorganic layers is defined by forming a barrier layer outside the display portion, outer edges of the inorganic layers can be prevented from expanding, thereby reducing a frame of the display panel.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
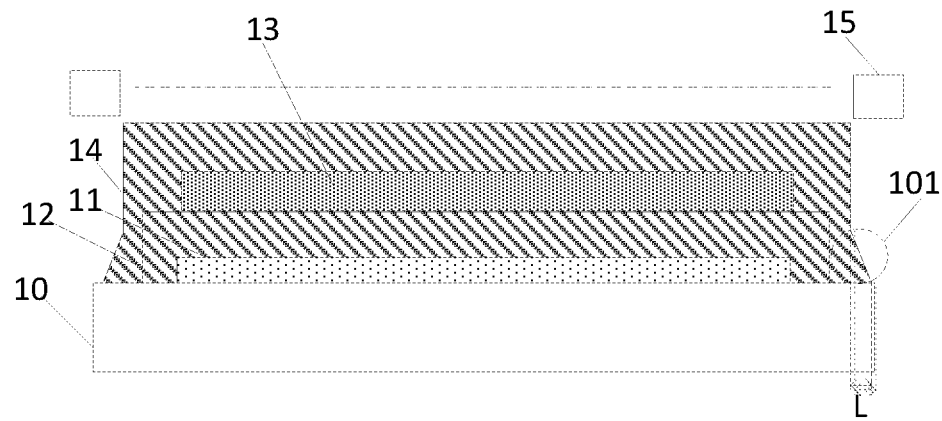
FIG. 1 is a schematic structural view of a conventional display panel.

As shown in FIG. 1, a conventional method of manufacturing a display panel includes sequentially forming a display portion 11, a first inorganic layer 12, an organic layer 13, and a second inorganic layer 14, wherein the first inorganic layer 12 and the second inorganic layer 14 are formed through a chemical vapor deposition (CVD) process. Since masks are required during the CVD process and reaction gases diffuse to edges during the process, bottoms of side walls of the second inorganic layer will extend outward of the second inorganic layer (as shown by an enclosure 101 in dashed lines). The display portion 11 includes a switch array layer, an anode layer, an organic light-emitting layer, and a cathode, wherein a frame offset is designated as L.

Figure 2:
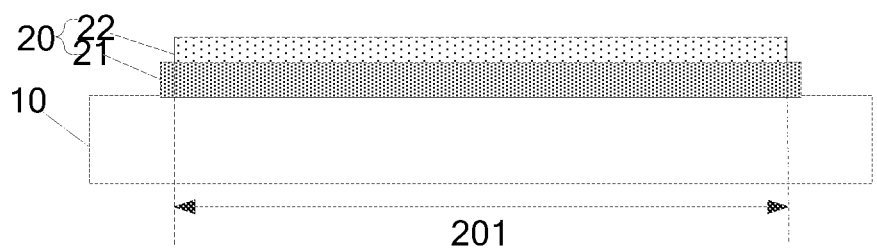
FIG. 2 is a schematic structural view according to a first step of a method of manufacturing the display panel of the present invention.

Please refer to FIGS. 2 to 8. FIG. 2 is a schematic structural view according to a first step of a method of manufacturing the display panel of the present invention.

A method of manufacturing a display panel in the embodiment of the present invention includes:

S101: fabricating a display portion on a glass substrate.

Specifically, as shown in FIG. 2, a display portion 20 is fabricated on a glass substrate 10, wherein the display portion 20 includes a switch array layer 21 and an organic light-emitting display layer 22. The switch array layer 21 includes a plurality of switch elements. The organic light-emitting display layer 22 includes an anode, an organic light-emitting layer, and a cathode layer. The display portion 20 may include a display area 201.

S102: forming a barrier layer on the glass substrate outside the display portion.

Figure 3:
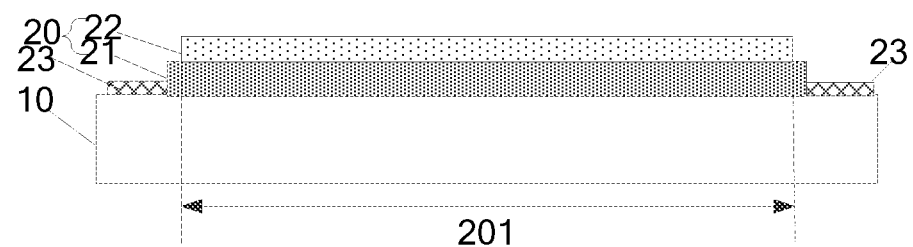
FIG. 3 is a schematic structural view according to a second step of the method of manufacturing the display panel of the present invention.
Figure 4:
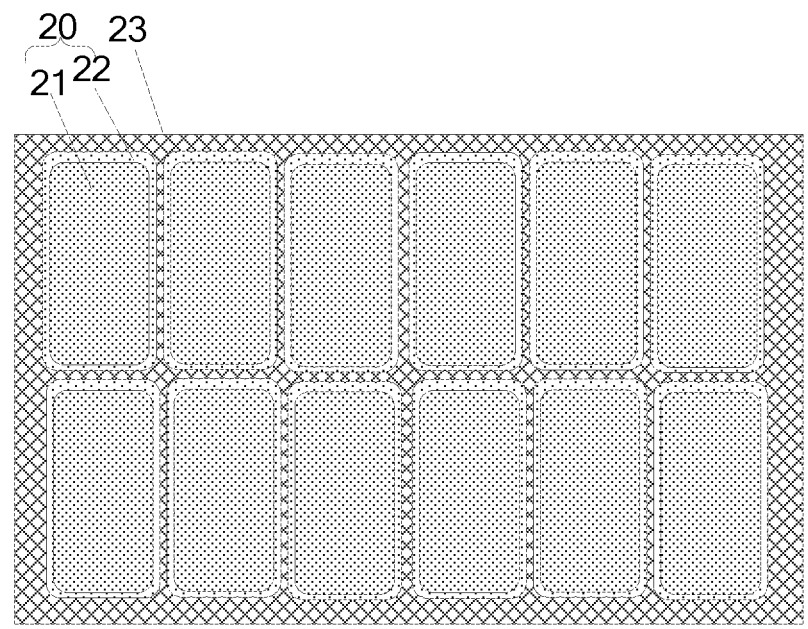
FIG. 4 is a top plan view according to the second step of the method of manufacturing the display panel of the present invention.

Specifically, as shown in FIGS. 3 and 4, a barrier layer 23 is formed on the glass substrate outside the display portion 20, that is, the barrier layer 23 does not cover the display portion 20. Although a plurality of display panels are taken as an example in FIG. 4, the present invention is not limited thereto. It can be understood that a structure of a single display panel is similar to that of the present embodiment. In one embodiment, the barrier 23 adjoins the display portion 20. In another embodiment, the barrier layer 23 may be spaced apart from the display portion 20. A distance between the barrier layer 23 and the display portion 20 is defined according to a predetermined frame width of the display panel. That is, the distance between the barrier layer 23 and the display portion 20 is defined according to an actual frame width of the display panel. Further referring to FIG. 1, in order to reduce a frame width, a distance between the barrier layer 23 and the display portion 20 is defined according to a predetermined frame width of the display panel and the frame offset L.

In one embodiment, in order to facilitate subsequent processes and to simplify the processes, the barrier layer 23 is adhesively attached to the glass substrate 10 outside the display portion 20. In order to remove the barrier layer, an adhesion force between the barrier layer 23 and the glass substrate 10 is less than a preset value. That is, the adhesion force between the barrier layer 23 and the glass substrate 10 is relatively small.

The barrier layer 23 is configured to block moisture and oxygen and to protect the glass substrate. Specifically, the barrier layer protects the glass substrate from being damaged during a subsequent laser cutting process.

S103: forming an encapsulation film on the barrier layer and the display portion.

Figure 5:
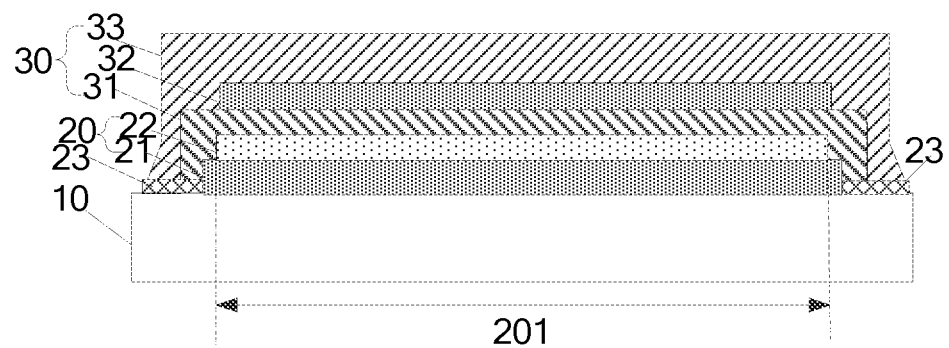
FIG. 5 is a schematic structural view according to a third step of the method of manufacturing the display panel of the present invention.

Specifically, as shown in FIG. 5, an encapsulation film 30 is formed on the barrier layer 23 and the display portion 20. In one embodiment, the encapsulation film 30 includes a first inorganic layer 31, an organic layer 32, and a second inorganic layer 33. The step specifically includes:

S1031: forming a first inorganic layer on the barrier layer and the display portion.

For example, a first inorganic layer 31 is formed on the barrier layer 23 and the display portion 20, wherein the first inorganic layer 31 is made of a material including at least one of silicon nitride, silicon oxide, and aluminum oxide.

S1032: forming an organic layer on the first inorganic layer corresponding to the display area.

For example, in one embodiment, an organic layer 32 is formed on the first inorganic layer 31 by inkjet printing, and a position of the organic layer 32 corresponds to positions of a plurality of the display areas 201. That is, the organic layer 32 is disposed on the first inorganic layer corresponding to one of the display areas.

S1033: forming a second inorganic layer on the organic layer.

For example, a second inorganic layer 33 is formed on the organic layer 32, wherein the second inorganic layer 33 covers the first inorganic layer 31. That is, the second inorganic layer 33 is disposed on the organic layer 32 and on the first inorganic layer 31 not covered by the organic layer 32. The second inorganic layer 33 may cover the first inorganic layer 31 and the organic layer 32. The second inorganic layer 33 is made of a material including at least one of silicon nitride, silicon oxide, and aluminum oxide. It can be understood that a structure of the encapsulation film is not limited to the above.

S104: obtaining a panel area by removing the barrier layer and the encapsulation film outside the predetermined limited area.

Figure 6:
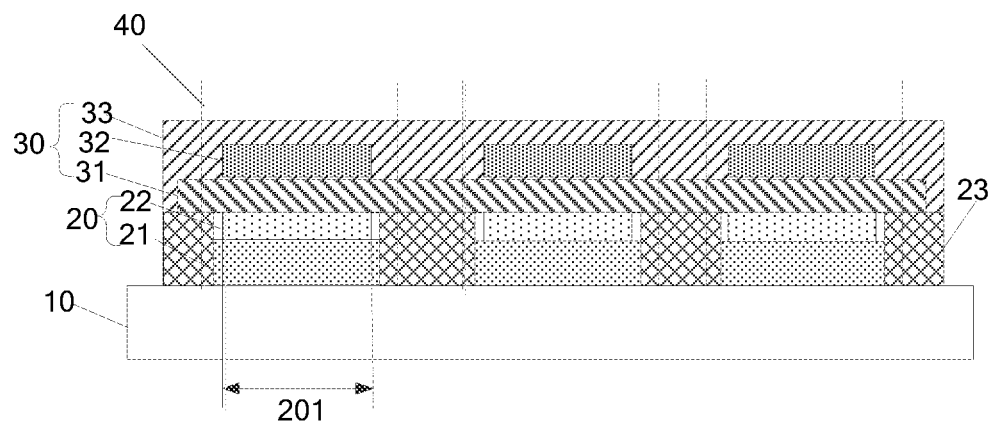
FIG. 6 is a schematic structural view according to a first sub-step of a fourth step of the method of manufacturing the display panel of the present invention.
Figure 7:
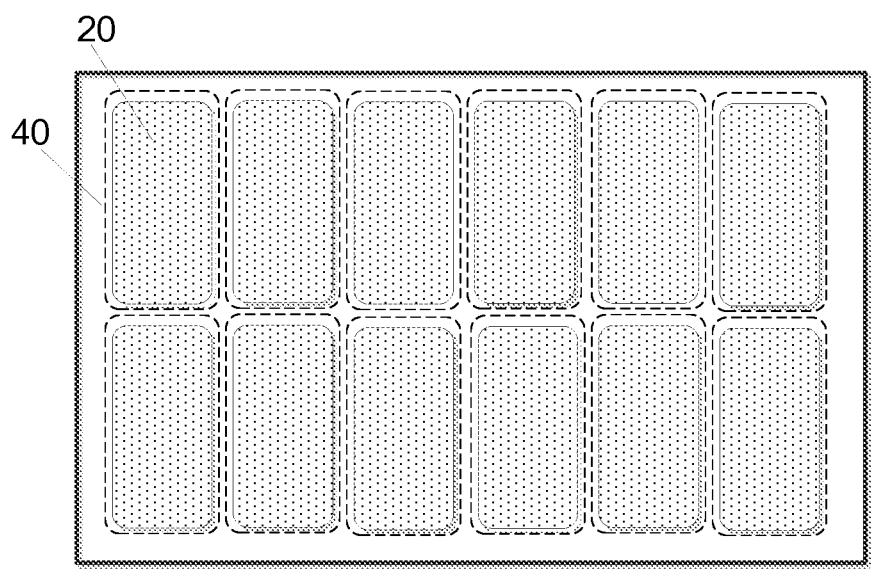
FIG. 7 is a top plan view according to the first sub-step of the fourth step of the method of manufacturing the display panel of the present invention.
Figure 8:
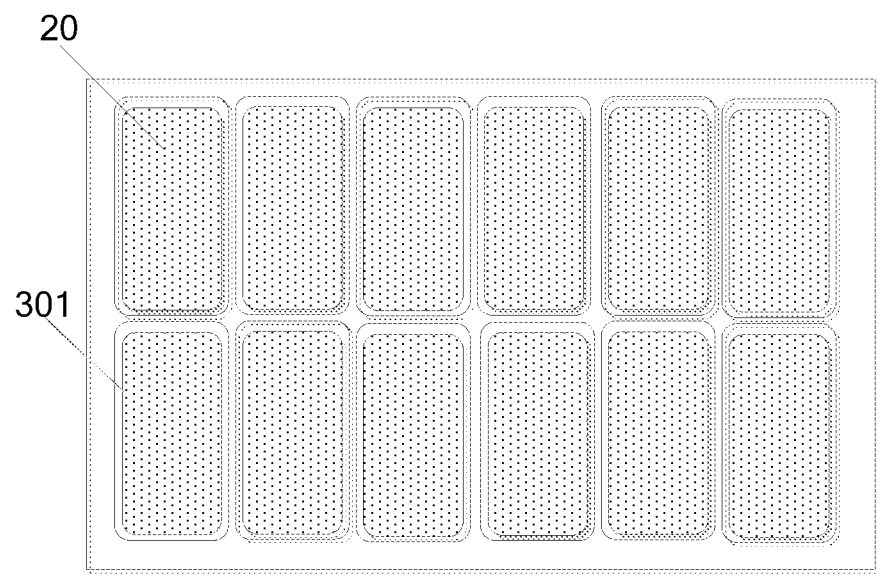
FIG. 8 is a top plan view according to a second sub-step of the fourth step of the method of manufacturing the display panel of the present invention.

Further referring to FIGS. 6 to 8, a predetermined limited area 301 is configured to define the panel area, that is, to limit a size of the panel area. Each of a plurality of display portions 20 is corresponding to one of a plurality of predetermined limited areas 301. The predetermined limited area 301 has an orthographic projection on the glass substrate 10 with an area greater than that of an orthographic projection of the display portion 20 on the glass substrate 10. The step specifically includes:

S1041: separating the barrier layer and the encapsulation film outside the predetermined limited area from the barrier layer and the encapsulation film in the predetermined limited area.

For example, as shown in FIGS. 6 to 8, the barrier layer and the encapsulation film outside each of the predetermined limited areas 301 are separated from the barrier layer and the encapsulation film in each of the predetermined limited areas 301.

In one embodiment, the step may include:

S201: the barrier layer and the encapsulation film outside the predetermined limited area on the glass substrate are separated from the barrier layer and the encapsulation film in the predetermined limited area through a laser cutting method along a predetermined cutting line.

For example, as shown in FIGS. 6 and 7, use a laser cutting method to separate the barrier layer and the encapsulation film outside the predetermined limited area (defined by dashed lines) on the glass substrate from the barrier layer and the encapsulation film in the predetermined limited area along a predetermined cutting line 40. Further referring to FIG. 8, a position of the predetermined cutting line 40 corresponds to a position of an edge of the predetermined limited area 301.

The laser cutting method can be implemented using a carbon dioxide ($CO_2$) laser cutting machine.

S1042: peeling away the barrier layer and the encapsulation film outside the predetermined limited area.

For example, as shown in FIG. 8, the barrier layer and the encapsulation film outside the predetermined limited area 301 are peeled away to obtain a plurality of panel areas, and number of the panel areas is certainly not limited thereto. A single panel can be obtained by cutting the panel areas in a subsequent process. Although a plurality of display panels are taken as an example in FIGS. 7 and 8, the present invention is not limited thereto. It can be understood that the structure of a single display panel is similar to that of the present embodiment.

A method of manufacturing a display panel of the present invention is implemented by fabricating a display portion on a glass substrate; forming a barrier layer on the glass substrate outside the display portion; forming an encapsulation film on the barrier layer and the display portion; and removing the barrier layer and the encapsulation film outside a predetermined limited area on the glass substrate to obtain a panel area, wherein the predetermined limited area corresponds to the display portion. Because a film formation area of inorganic layers is defined by forming a barrier layer outside the display portion, outer edges of the inorganic layers can be prevented from expanding, thereby reducing a frame of the display panel.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A method of manufacturing a display panel, comprising:
   fabricating a display portion on a glass substrate;
   forming a barrier layer on the glass substrate outside the display portion, wherein the barrier layer is adhesively attached to the glass substrate outside the display portion;
   forming an encapsulation film on the barrier layer and the display portion;
   separating the barrier layer and the encapsulation film outside a predetermined limited area on the glass substrate from the barrier layer and the encapsulation film in the predetermined limited area; and
   obtaining, by peeling away the barrier layer and the encapsulation film outside the predetermined limited area, a panel area, wherein the predetermined limited area corresponds to the display portion,
   wherein the barrier layer is spaced apart from the display portion, and a distance between the barrier layer and the display portion is defined according to a predetermined frame width of the display panel.

2. The method of manufacturing the display panel of claim 1, wherein the barrier layer and the encapsulation film outside the predetermined limited area on the glass substrate are separated from the barrier layer and the encapsulation film in the predetermined limited area through a laser cutting method along a predetermined cutting line, wherein the predetermined cutting line corresponds to a position of an edge of the predetermined limited area.

3. The method of manufacturing the display panel of claim 1, wherein the predetermined limited area has an orthographic projection on the glass substrate with an area greater than that of an orthographic projection of the display portion on the glass substrate.

4. The method of manufacturing the display panel of claim 1, wherein the display portion comprises a display area, and the forming the encapsulation film on the barrier layer and the display portion comprises:
   forming a first inorganic layer on the barrier layer and the display portion;
   forming an organic layer on the first inorganic layer corresponding to the display area; and
   forming a second inorganic layer on the organic layer, wherein the second inorganic layer covers the first inorganic layer.

5. The method of manufacturing the display panel of claim 1, wherein the barrier layer is configured to block moisture and oxygen and to protect the glass substrate.

6. A method of manufacturing a display panel, comprising:
   fabricating a display portion on a glass substrate;
   forming a barrier layer on the glass substrate outside the display portion;
   forming an encapsulation film on the barrier layer and the display portion; and
   obtaining, by removing the barrier layer and the encapsulation film outside a predetermined limited area on the glass substrate, a panel area, wherein the predetermined limited area corresponds to the display portion,
   wherein the barrier layer is spaced apart from the display portion, and a distance between the barrier layer and the display portion is defined according to a predetermined frame width of the display panel.

7. The method of manufacturing the display panel of claim 6, wherein the removing the barrier layer and the encapsulation film outside the predetermined limited area on the glass substrate comprises:
   separating the barrier layer and the encapsulation film outside the predetermined limited area from the barrier layer and the encapsulation film in the predetermined limited area; and
   peeling away the barrier layer and the encapsulation film outside the predetermined limited area.

8. The method of manufacturing the display panel of claim 7, wherein the barrier layer and the encapsulation film outside the predetermined limited area on the glass substrate are separated from the barrier layer and the encapsulation film in the predetermined limited area through a laser cutting method along a predetermined cutting line, wherein the predetermined cutting line corresponds to a position of an edge of the predetermined limited area.

9. The method of manufacturing the display panel of claim 6, wherein the predetermined limited area has an orthographic projection on the glass substrate with an area greater than that of an orthographic projection of the display portion on the glass substrate.

10. The method of manufacturing the display panel of claim 6, wherein the display portion comprises a display area, and the forming the encapsulation film on the barrier layer and the display portion comprises:
    forming a first inorganic layer on the barrier layer and the display portion;
    forming an organic layer on the first inorganic layer corresponding to the display area; and
    forming a second inorganic layer on the organic layer, wherein the second inorganic layer covers the first inorganic layer.

11. The method of manufacturing the display panel of claim 10, wherein the first inorganic layer is made of a material comprising at least one of silicon nitride, silicon oxide, and aluminum oxide.

12. The method of manufacturing the display panel of claim 6, wherein the barrier layer is adhesively attached to the glass substrate outside the display portion.

13. The method of manufacturing the display panel of claim 6, wherein the barrier layer is configured to block moisture and oxygen and to protect the glass substrate.

14. The method of manufacturing the display panel of claim 6, wherein the display portion comprises a switch array layer and an organic light-emitting display layer.

* * * * *